United States Patent [19]
Michel et al.

[11] Patent Number: 5,952,705
[45] Date of Patent: Sep. 14, 1999

[54] MONOLITHICALLY INTEGRATED PLANAR SEMI-CONDUCTOR ARRANGEMENT WITH TEMPERATURE COMPENSATION

[75] Inventors: Hartmut Michel, Reutlingen; Christian Pluntke, Hechingen; Alfred Goerlach, Kusterdingen, all of Germany

[73] Assignee: Robert Bosch GmbH, Stuttgart, Germany

[21] Appl. No.: 08/981,985

[22] PCT Filed: Jun. 18, 1996

[86] PCT No.: PCT/DE96/01073

§ 371 Date: Jan. 9, 1998

§ 102(e) Date: Jan. 9, 1998

[87] PCT Pub. No.: WO97/04486

PCT Pub. Date: Feb. 6, 1997

[30] Foreign Application Priority Data

Jul. 22, 1995 [DE] Germany .................. 195 26 902

[51] Int. Cl.⁶ .................. H01L 29/70; H01L 29/735
[52] U.S. Cl. .................. 257/551; 257/552; 257/572
[58] Field of Search .................. 354/24; 257/551, 257/567, 572, 361, 577, 175

[56] References Cited

U.S. PATENT DOCUMENTS

| | | | |
|---|---|---|---|
| 4,284,334 | 8/1981 | Magel | 354/24 |
| 4,677,369 | 6/1987 | Bower | 257/551 |
| 4,742,021 | 5/1988 | Burnham et al. | 257/551 |
| 4,766,469 | 8/1988 | Hill | 257/551 |
| 5,077,590 | 12/1991 | Fujihira | 257/551 |
| 5,449,949 | 9/1995 | Michel et al. | 257/567 |
| 5,466,959 | 11/1995 | Goerlach et al. | 257/361 |
| 5,479,046 | 12/1995 | Flohrs et al. | 257/577 |
| 5,502,338 | 3/1996 | Suda et al. | 257/551 |
| 5,521,421 | 5/1996 | Furuhata | 257/551 |
| 5,545,914 | 8/1996 | Kumano | 257/551 |

*Primary Examiner*—Olik Chaudhuri
*Assistant Examiner*—William David Coleman
*Attorney, Agent, or Firm*—Kenyon & Kenyon

[57] ABSTRACT

A semiconductor, where a region is introduced into a semiconductor substrate and, together with this substrate, forms a p-n junction. Provision is made in the vicinity of the space charge region being formed for a covering electrode and a heavily doped region. The covering electrode is coupled to a voltage divider, through which the potential of the covering electrode is adjusted with temperature compensation.

7 Claims, 5 Drawing Sheets

MONOLITHICALLY INTEGRATED PLANAR SEMI-CONDUCTOR ARRANGEMENT WITH TEMPERATURE COMPENSATION

FIELD OF THE INVENTION

The present invention relates to a semiconductor arrangement.

BACKGROUND INFORMATION

A semiconductor arrangement is described in European Patent No. 99 897, where into a substrate that is weakly doped with a first conductivity type is introduced a region of a second conductivity type, which, together with the substrate, forms a p-n junction. To influence the breakdown voltage between the introduced region and the substrate, a cover electrode, which is separated from the substrate by a thin oxide layer, is applied to the surface. The breakdown voltage of the p-n junction is regulated by adjusting the potential of this cover electrode by means of a voltage divider.

Likewise disclosed by European Patent No. 179 099 is a semiconductor arrangement of this kind, where the voltage divider is formed by variably doped integrated resistors. This achieves a certain compensation of the temperature dependency of the breakdown voltage. In this context, additional process steps are required because of the variably doped divider resistors. Furthermore, resistors of this kind require a comparatively large chip surface.

SUMMARY OF THE INVENTION

The advantage of the semiconductor arrangement of the present invention is that the temperature dependency of the breakdown voltage is compensated for quite efficiently. In this context, no additional process steps are needed to produce the voltage divider, and the need for chip surface for the integrated voltage divider is minimal.

The elements having positive temperature coefficients are formed quite simply with resistors, Zener diodes, or combinations thereof. For the component having a negative temperature coefficient, a transistor is simply used. The transistor has an emitter-base voltage which exhibits a negative response to temperature changes. The transistor is expediently integrated quite compactly into the substrate, where the introduced region also serves as a collector for the transistor. To achieve a very precisely defined breakdown voltage, it is advantageous to use a heavily doped region with the conductivity type of the substrate in the region of the space charge region.

DETAILED DESCRIPTION OF THE INVENTION

Figure 1:
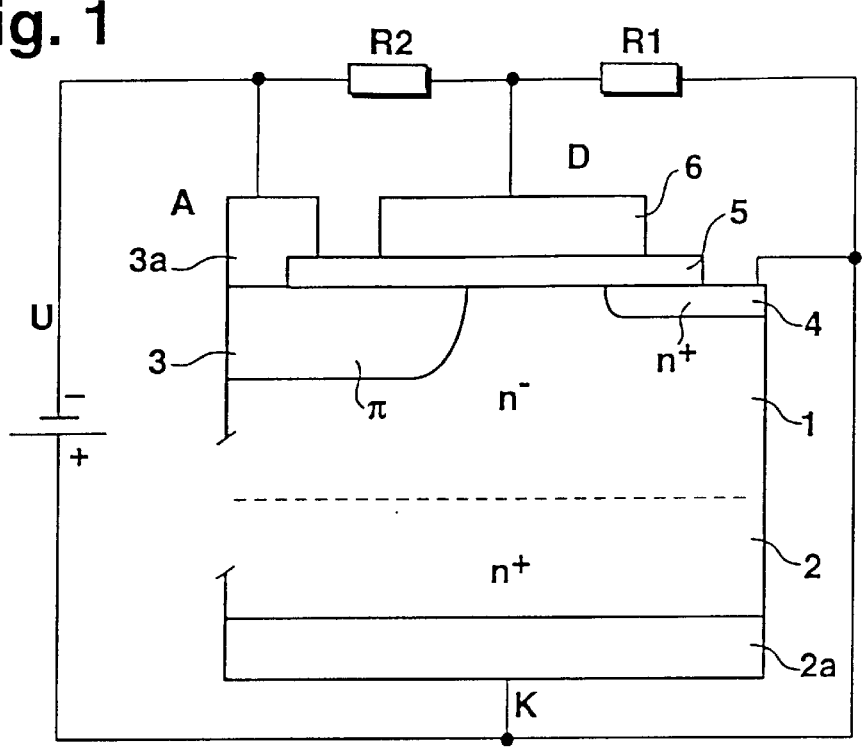
FIG. 1 illustrates a cross-section through a conventional semiconductor arrangement.

FIG. 1 illustrates a semiconductor arrangement in accordance with European Patent No. 99 897. The semiconductor arrangement has a substrate with an upper weakly n-doped layer 1 and a bottom heavily n-doped layer 2. The bottom layer is contacted by a metal layer 2a on the reverse side. Introduced into the top side of the substrate, into n-layer 1 are a weak p-diffusion 3 and a strong n-diffusion 4, referred to in the following as π-diffusion 3 and N+ diffusion 4. Provision is made on the top side of the substrate for a covering oxide layer 5 with a covering electrode 6 mounted thereon. Covering electrode 6 and covering oxide 5 cover the region of n-layer 1 disposed between π-diffusion 3 and N+ diffusion 4. Provision is also made for a connection metallization 3a for contacting π-region 3. To assure an ohmic contact, also disposed beneath region 3a is a heavy p-doping, which is not shown here, however, for the sake of clarity. Metallization 3a is connected to the negative pole, and metallization 2a to the positive pole of an operating voltage U. Covering electrode 6 is connected to the tap of a voltage divider R1, R2 which is disposed between the positive and negative pole of the operating voltage. The potential of the covering electrode is adjusted by this voltage divider to a value that lies between the positive and negative operating voltage. N+ doping 4 likewise exhibits the potential of metallization 2a on the reverse side.

The functioning of this arrangement has already been described in detail in European Patent No. 99 897. The purpose of the device shown is the controlled adjustment of the breakdown voltage between π-region 3 and the substrate. In this context, the breakdown voltage is understood to be the maximum possible blocking reverse voltage that can be applied between the p-doped region 3 and the n-doped substrate. The breakdown between π-doping 3 and N+doping 4 occurs because of the immediate proximity of these two regions. The breakdown voltage is able to be influenced through the potential at covering electrode 6, in particular it is able to be optimized by correctly rating the ratios of resistors R1 and R2. In this context, besides having a highest possible breakdown voltage, it is desirable to be able to control the absolute value of the breakdown voltage as precisely as possible. In particular, the value of the breakdown voltage should be independent of the operating temperature of the semiconductor component.

Figure 2:
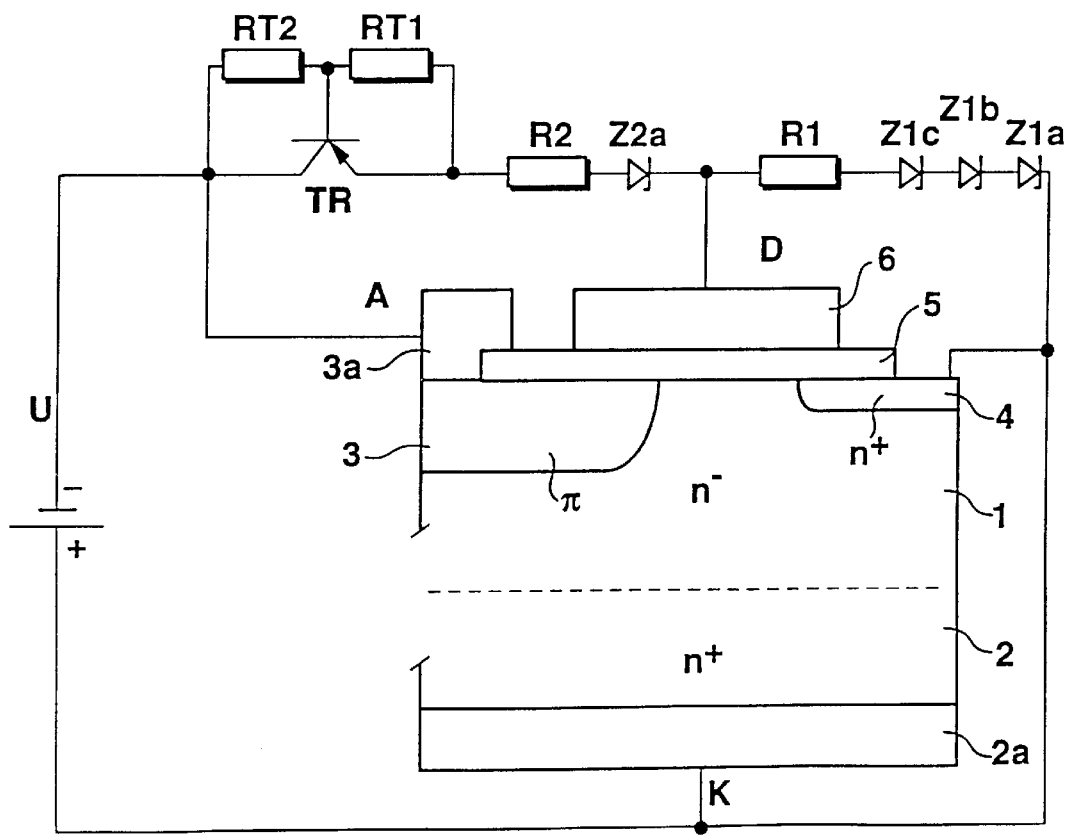
FIG. 2 illustrates a cross-section through a semiconductor arrangement, according to an embodiment of the present invention, with the voltage divider symbolically represented.

A first exemplary embodiment of the semiconductor component of the present invention is shown in FIG. 2. Elements having the same function are again denoted with the same reference numerals as in FIG. 1. In contrast to the related art as depicted by FIG. 1, the exemplary embodiment according to FIG. 2 shows an improved voltage divider. The negative pole of the supply voltage and, thus, also metallization 3a of π-doping 3 is connected to the collector of a PNP auxiliary transistor TR. The emitter of auxiliary transistor TR is linked to a resistor R2. The emitter-base path of auxiliary transistor TR is bridged by a resistor RT1, and the base-collector path of auxiliary transistor TR is bridged by a resistor RT2. Resistor R2 is connected to the anode of a Zener diode Z2a. The cathode of Zener diode Z2a is linked to the voltage tap for covering electrode 6 and to a terminal of a resistor R1. The other terminal of resistor R1 is coupled to the anode of a Zener diode Z1c. The cathode of Zener diode Z1c is linked to the anode of another Zener diode Z1b. The cathode of Zener diode Z1b is coupled to the anode of a Zener diode Z1a. The cathode of Zener diode Z1a is coupled to the heavy N+ doping 4, the metallization 2a on the reverse side, and the positive operating voltage terminal.

Breakdown voltage U is a function of the voltage drops across the individual components of the voltage divider, as expressed by the following formula:

$$U = U_1 \times \{UR_1 + UR_2 + UZ(n+m) + UCE\}/\{UR_1 + mUZ\}.$$

In this context, UR1 and UR2 are the voltage drops across resistors R1, R2; UZ is the voltage drop across each Zener diode; m+n is the number of Zener diodes where as illustrated n equals 1 and m equals 3; and U1 is the breakdown voltage obtained when the voltage drop between anode A and covering electrode D is zero. Voltage drop UCE across the collector-emitter path of auxiliary transistor TR is a function of base-emitter voltage UBE of transistor TR, as expressed by the following formula:

$$UCE = UBE \times (1 + RT_2/RT_1).$$

Zener diodes Z1 and Z2 operate in accordance with the avalanche effect and, therefore, exhibit a positive temperature coefficient. In addition, resistors R1, R2, RT1 and RT2 exhibit a positive temperature coefficient, i.e., their resistance increases with rising temperature. Voltage U1 likewise exhibits a positive temperature coefficient. The voltage drop across auxiliary transistor TR is determined by voltage drop UBE at the base-emitter path. This voltage drop exhibits a negative temperature coefficient. Since the voltage divider thus has elements with positive and negative temperature coefficients, the temperature dependency can be substantially compensated at the tap of the voltage divider. By appropriately selecting the resistance values, the voltages of the Zener diodes and of auxiliary transistor TR, one is able to achieve a breakdown voltage of the component that is substantially independent of the temperature. In addition, all components used can be integrated in an especially space saving manner, using conventional techniques, into the semiconductor substrate. By this means, a semiconductor element having a defined breakdown voltage is able to be created quite simply.

Figure 3:
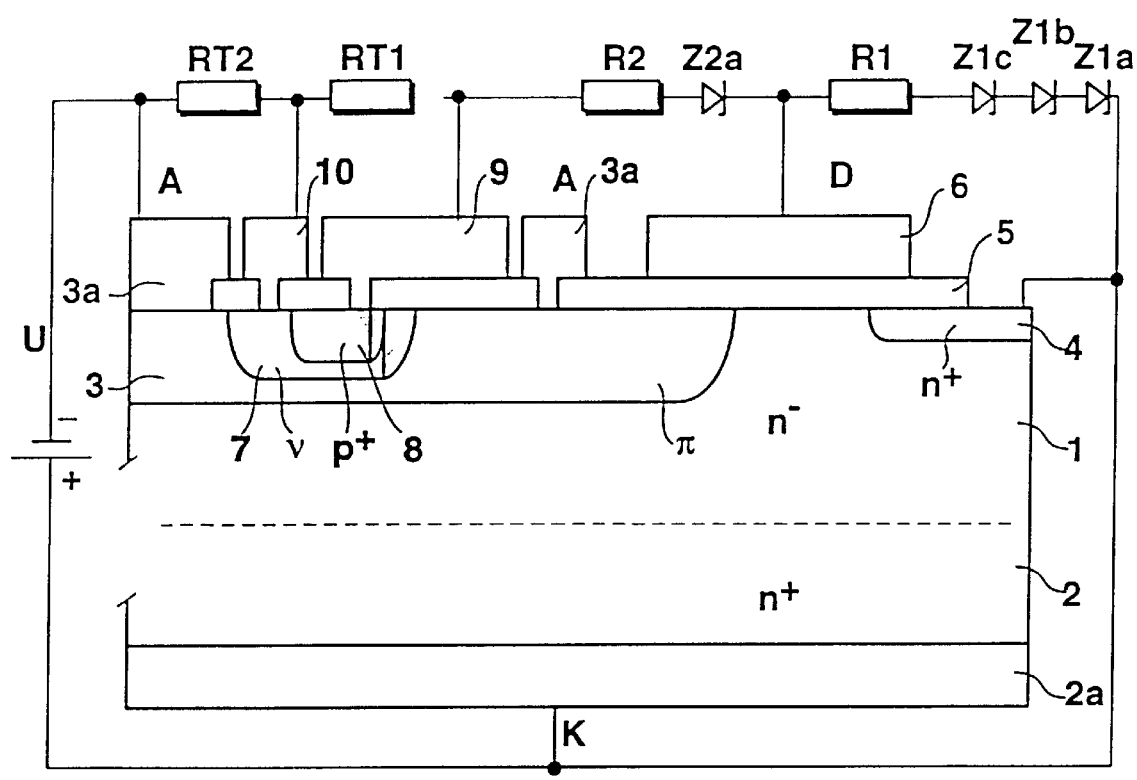
FIG. 3 illustrates the cross-section of FIG. 2 with the diffusion regions introduced for the transistor, according to an embodiment of the present invention.

In FIG. 3, the semiconductor component according to FIG. 2 is depicted more concretely to the effect that the auxiliary transistor drawn merely as a circuit symbol in FIG. 2, is shown in FIG. 3 as diffusion regions having the corresponding terminal connection pads. For auxiliary transistor TR, a weak N-doping region 7 and a P+ doping region 8 are introduced into the π-doping region 3. P+ doping region 8 constitutes the emitter, weak N-doping region 7 the base, and π-doping region 3 the collector of auxiliary transistor TR. Emitter metallization 9 is connected between resistor RT1 and R2. Base-metallization 10 of auxiliary transistor TR is between resistors RT2 and RT1.

It should be noted here that it is only possible for auxiliary transistor TR to be integrated in π-doping 3 because of the potentials of the voltage divider being applied. When a blocking voltage is applied between the π-metallization and N-dopings 1, 2, 4 of the substrate, the result is that a blocking region is formed, which extends into π-doping 3 or into N-doping 1. If the blocking region reaches N-doping 7, the functioning of auxiliary transistor TR is disturbed (punch through). However, since voltages to this effect are present at N-region 7 or π-region 3 because of voltage divider RT2, RT1, such a malfunctioning of auxiliary transistor TR is avoided. Therefore, no further protective measures are needed to integrate auxiliary transistor TR in π-region 3.

The semiconductor element described in FIGS. 2 and 3 constitutes a diode between π-doping 3 and the n-doped substrate. However, it is also possible to introduce other diffusion regions into π-region 3, e.g., to form a transistor. In addition, provision can also be made in the substrate for other regions, for example in order to produce a Darlington transistor. In the following FIGS. 4, 5 and 6, an integrated Darlington transistor is shown in a plan view, all elements of the voltage divider known from FIGS. 2 and 3 being additionally integrated in the substrate.

Figure 4:
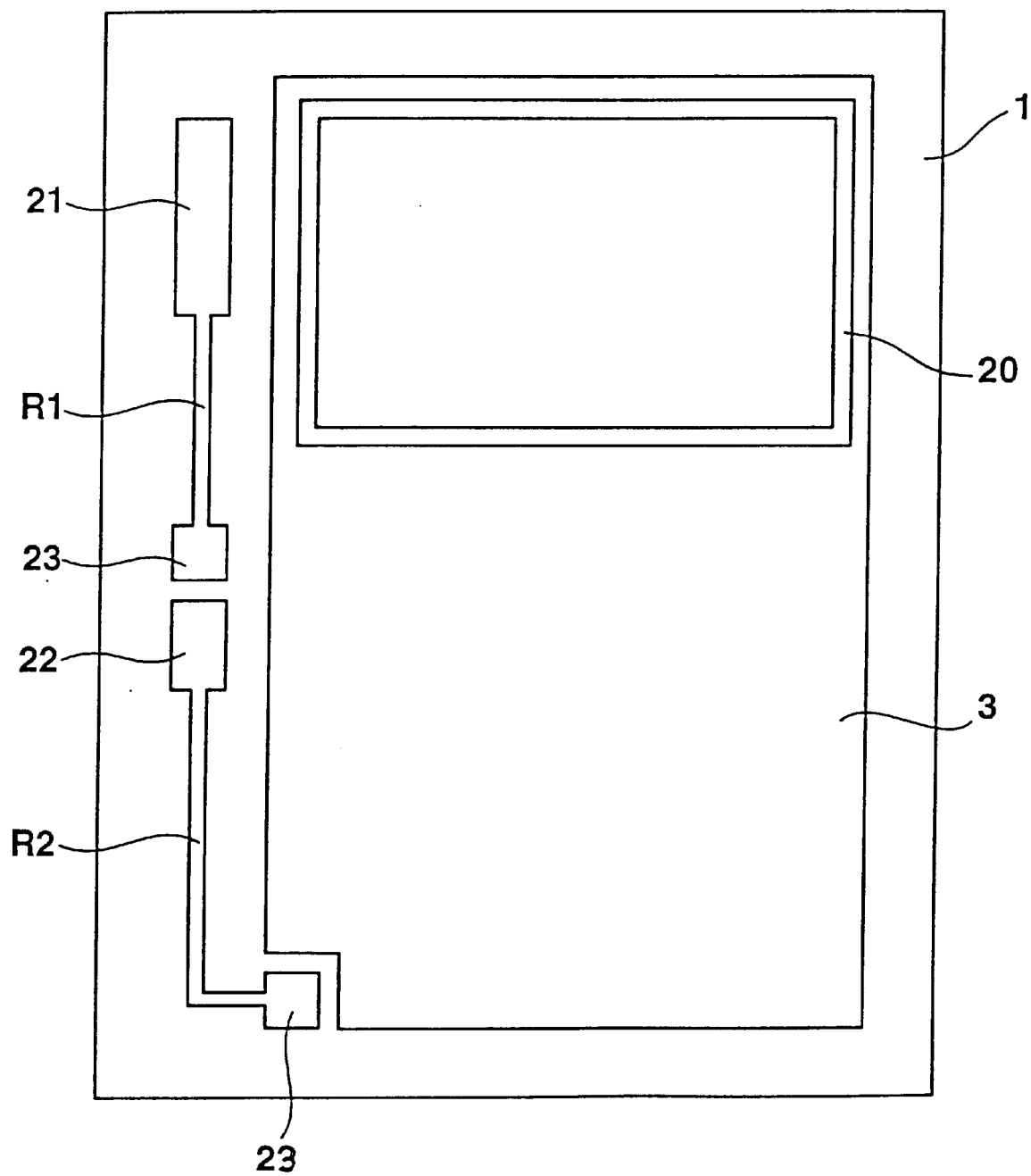
FIG. 4 illustrates a plan view of an exemplary embodiment according to the present invention.

In FIG. 4, a plan view is shown of the upper weakly n-doped layer 1 of a semiconductor substrate. Diffused into this weakly n-doped layer 1 is a weakly doped π-layer. The largest area is taken up by π-layer 3, as is already known from FIGS. 2 and 3. In this case, layer 3 forms the base of a Darlington transistor. The base of the corresponding Darlington driver transistor is formed by the weakly p-doped region 20 disposed within π-layer 3. Furthermore, provision is made for a P-well 21 for Zener diodes Z1a through Z1c. A further well 22 is provided for Zener diode Z2a. Resistors R1 and R2 are formed by the elongated indiffused P-strips. These resistors R1 and R2 each lead into terminal regions 23, where provision is made for a metallization connection.

Figure 5:
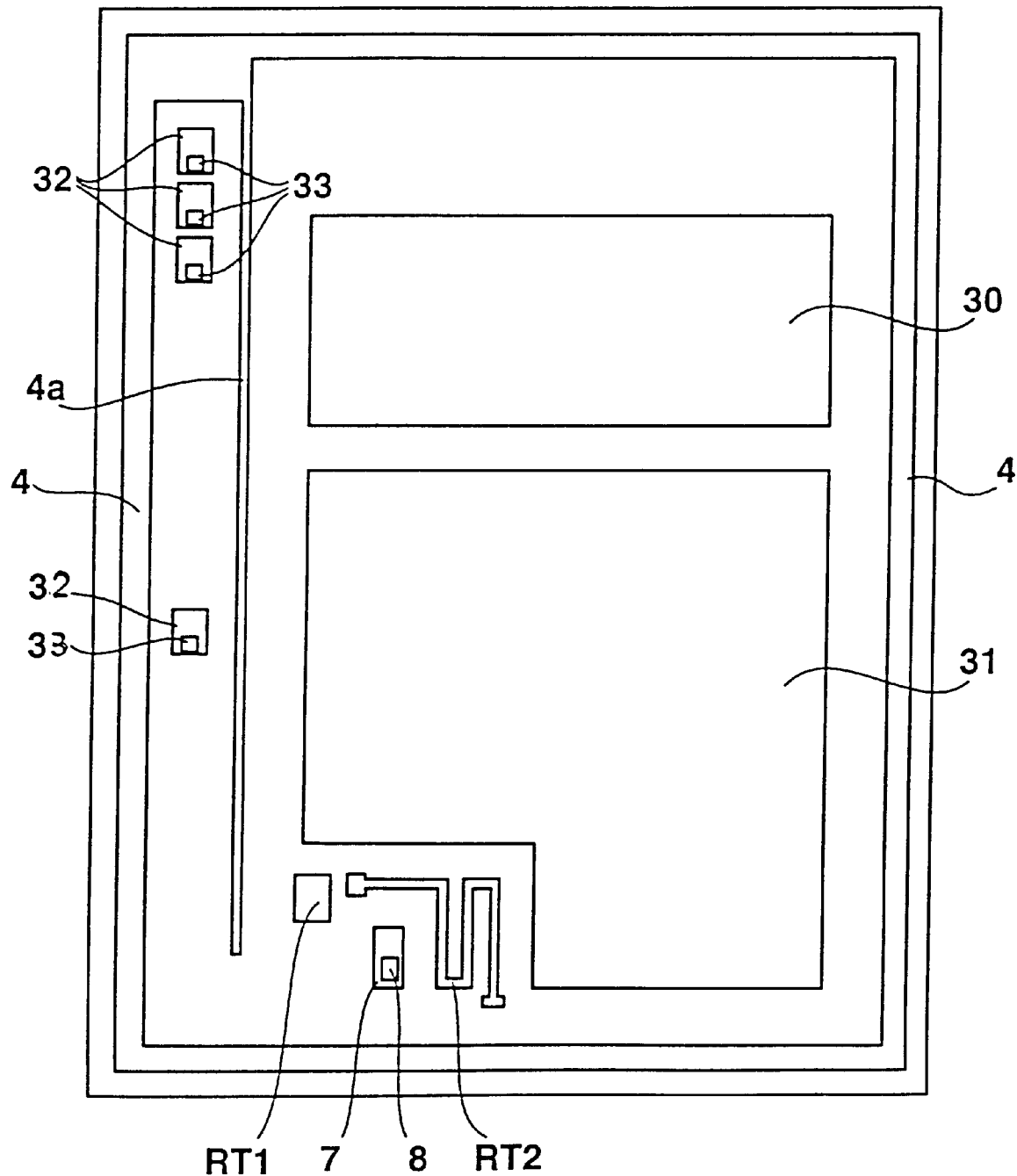
FIG. 5 illustrates a plan view of an exemplary embodiment according to the present invention.

In the plan view of FIG. 5, a few weak n-dopings are shown, which are each introduced into P-regions that have been illustrated in FIG. 4. The weakly doped regions 30 and 31 constitute the emitter of the Darlington driver transistor and of the Darlington transistor. Provision is made for other weakly doped regions for resistors RT1 and RT2 of the auxiliary transistor and for base 7 of the auxiliary transistor. The cathodes of Zener diodes Z1 and Z2 are configured by weak end doping regions 32. Also discernible in the plan view is heavy n-doping 4. Heavy n-doping 4, which has more or less a frame shape, passes over into a strip-shaped heavy n-doping 4a, by means of which the substrate regions in which the Darlington transistors are arranged are separated from those regions in which the diodes and resistors are arranged. Also shown in FIG. 5 are heavy p-doped regions, which are each embedded in the weakly n-doped regions. The regions 33 constitute the anodes of the Zener diodes and are embedded in the weakly n-doped cathodes 32. Heavy p-doping 8 constitutes the emitter of auxiliary transistor TR and is embedded in weakly doped base region 7.

Figure 6:
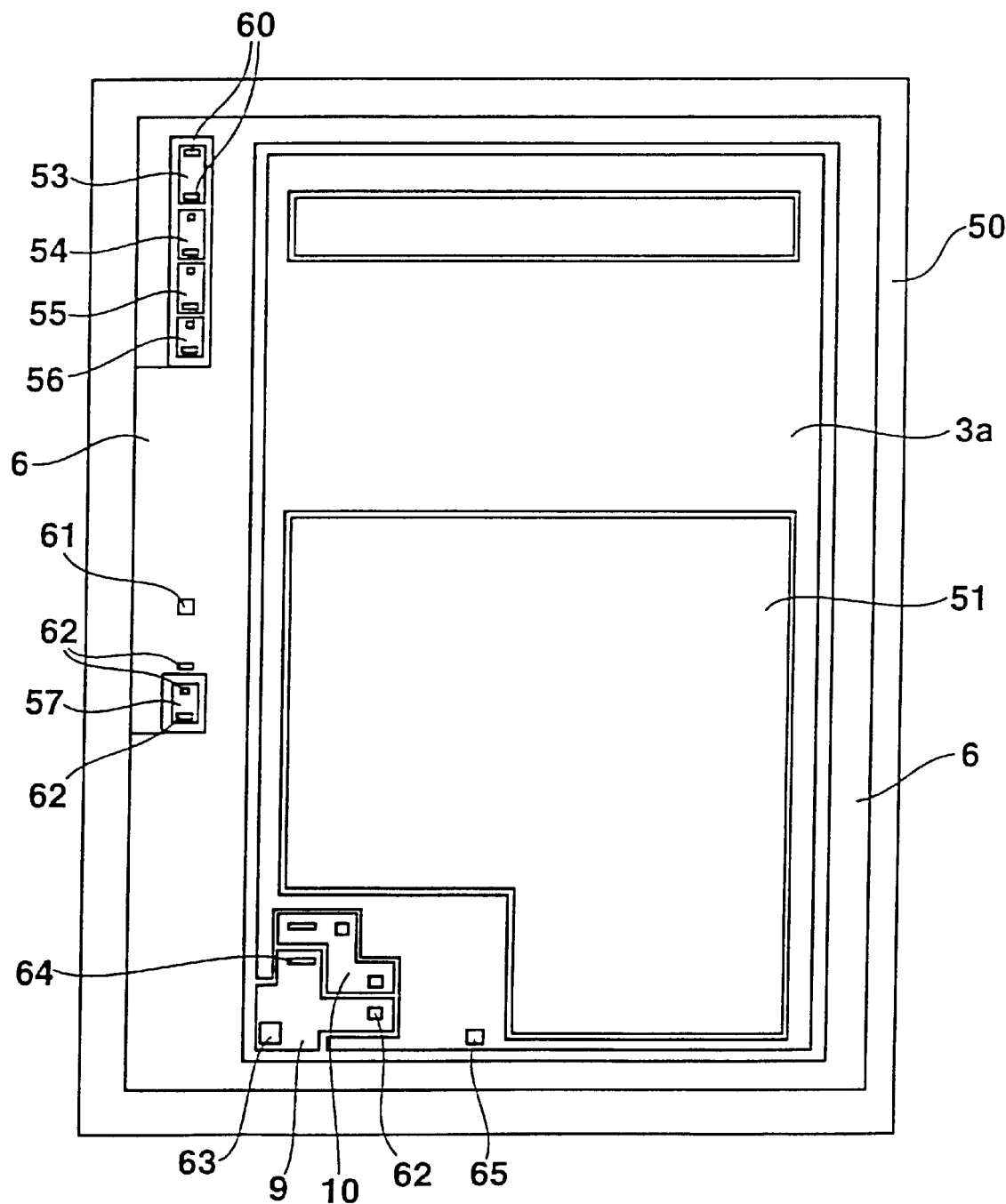
FIG. 6 illustrates a plan view of an exemplary embodiment according to the present invention.

FIG. 6 depicts a plan view of the semiconductor element, the metallization and contacting points being shown. The contacting points are openings in the passivation layers, which usually cover the surface of integrated semiconductors in which the metal layer is directly joined to underlying silicon layers. In this context, if the metal layer rested on a weakly doped region, a Schottky diode would be formed by the metal semiconductor junction. Diodes of this type can be avoided by providing heavy doping concentrations forming ohmic contacts.

By comparing FIGS. 6 and 4, one can discern that metallization 50 represents the base terminal of the Darlington driver transistor. By comparing FIGS. 6 and 5, one can discern that emitter 31 of the Darlington transistor is connected through metallization 51. Provision is also made underneath metallization 50 for a heavy P+ doping, to assure an ohmic contact to base region 20. Provision is also made underneath metallization 51 for a heavy N+ doping, to contact emitter 31 with an ohmic contact. The corresponding contacting points have not been shown here in FIGS. 4 and 5 for the sake of simplicity. Emitter 30 of the Darlington driver transistor is connected to base 3 of the Darlington transistor through metallization 3a. Again, for the sake of simplicity, the corresponding contacting points were not shown.

From an overall view with FIG. 5, one can discern that anode 32 of Zener diode Z1a is coupled to heavy N+ doping 4 through metallization 53 and contacts 60. Anode 33 of Zener diode Z1a is then coupled to the cathode of Zener diode Z1b through strip 54. The same applies to metal strip 55. The anode of Zener diode Z1c is coupled to well 21 shown in FIG. 4 and, thus, to resistor R1 through metal strip 56. Contact 61 couples resistor R1 to frame-shaped cover electrode 6. Thus, the tap of the voltage divider is formed by contact 61. Through contacts 62 and metallization 57, cathode 32 of Zener diode Z2a is connected to metallization 6, i.e., anode 33 is connected to P-well 22 and, thus, to resistor R2. At its other end, resistor R2 is connected by contact 63 to metallization 9 of auxiliary transistor TR. Metallization 9 is then coupled by contacts 64 to resistor RT1 and emitter region 8 of auxiliary transistor TR. Base 7 of the auxiliary transistor is then coupled via metallization 10 and corresponding contacts to resistor RT1 and to resistor RT2. Resistor RT2 is then linked via contact hole 65 to metal 3a establishing an ohmic contact to π-doping region 3. If contact holes 60 through 65 are in direct contact with weakly doped regions, the present invention contemplates heavy doping to produce ohmic contacts. These heavy dopings are not illustrated for the sake of simplicity.

Since a portion of the voltage being applied to the voltage divider drops across Zener diodes Z1, Z2 and transistor TR, resistors R1 and R2 can be designed to be relatively small. Overall, therefore, using Zener diodes clearly reduces the total requirement of the voltage divider compared to the voltage divider according to European Patent No. 99 897. The voltage divider is able to be substantially temperature-compensated by the auxiliary transistor. For auxiliary transistor TR, only those doping regions are used, which are needed anyway for the Darlington transistors shown here. Thus, no additional manufacturing steps are required for the auxiliary transistor.

FIGS. 1 through 6 each start out from an N-substrate with a π-region 3 introduced therein. It is, however, self-evident to one skilled in the art that each of the corresponding doping regions can be replaced by oppositely directed doping. An exemplary embodiment of this is a Darlington transistor. The invention, however, is applicable to any components where it is necessary for the breakdown voltage of a p-n junction to be adjusted with respect to the substrate. In addition, in one embodiment of the present invention, a PNP auxiliary transistor is used, which can be replaced just as well by an NPN transistor.

What is claimed is:

1. A monolithically integrated planar semiconductor arrangement comprising:
    at least one p-n junction formed by a substrate having a first conductivity type and by a region introduced into the substrate, the region having a second conductivity type opposite to the first conductivity type;
    a passivation layer arranged on the substrate;
    a covering electrode arranged on the passivation layer, the covering electrode covering a space charge region of the at least one p-n junction occurring in a blocking operation; and
    a voltage divider connected in parallel with the at least one p-n junction, the voltage divider being integrated in the semiconductor arrangement, the voltage divider including first elements with positive temperature coefficients and second elements with negative temperature coefficients, a tap of the voltage divider being coupled to the covering electrode.

2. The monolithically integrated planar semiconductor arrangement of claim 1, wherein the first elements include Zener diodes.

3. The monolithically integrated planar semiconductor arrangement of claim 1, wherein the first elements include resistors integrated in the semiconductor arrangement.

4. The monolithically integrated planar semiconductor arrangement of claim 1, wherein the second elements include a transistor integrated in the semiconductor arrangement,
    wherein a first resistor is coupled between a base of the transistor and an emitter of the transistor; and
    wherein a second resistor is coupled between the base of the transistor and a collector of the transistor.

5. The monolithically integrated planar semiconductor arrangement of claim 4, wherein the transistor is integrated in the introduced region.

6. The monolithically integrated planar semiconductor arrangement of claim 5, wherein the introduced region constitutes the collector of the transistor.

7. The monolithically integrated planar semiconductor arrangement of claim 1, further comprising a heavily doped region of the first conductivity type arranged beneath the covering electrode in a vicinity of the space charge region.

* * * * *